United States Patent
DiSarro et al.

(10) Patent No.: US 12,040,322 B2
(45) Date of Patent: Jul. 16, 2024

(54) COMPACT AREA ELECTROSTATIC DISCHARGE PROTECTION CIRCUIT

(71) Applicant: TEXAS INSTRUMENTS INCORPORATED, Dallas, TX (US)

(72) Inventors: James Paul DiSarro, Allen, TX (US); Aravind Chennimalai Appaswamy, Plano, TX (US); Zaichen Chen, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 228 days.

(21) Appl. No.: 17/321,466

(22) Filed: May 16, 2021

(65) Prior Publication Data

US 2022/0223580 A1 Jul. 14, 2022

Related U.S. Application Data

(60) Provisional application No. 63/136,888, filed on Jan. 13, 2021.

(51) Int. Cl.
*H01L 27/02* (2006.01)
*H01L 29/739* (2006.01)
*H02H 9/04* (2006.01)

(52) U.S. Cl.
CPC ...... *H01L 27/0262* (2013.01); *H01L 29/7393* (2013.01); *H02H 9/046* (2013.01)

(58) Field of Classification Search
CPC ............. H01L 27/0262; H01L 29/7393; H01L 29/1004; H01L 29/735; H01L 29/732; H02H 9/046

USPC .......................................................... 361/56
See application file for complete search history.

(56) References Cited

U.S. PATENT DOCUMENTS

| | | | |
|---|---|---|---|
| 6,442,008 B1 * | 8/2002 | Anderson | H01L 27/0259 361/111 |
| 10,249,610 B1 | 4/2019 | Appaswamy et al. | |
| 2015/0070806 A1 * | 3/2015 | Parthasarathy | H02H 9/04 361/57 |
| 2015/0325568 A1 * | 11/2015 | Chaudhry | H01L 27/0251 361/56 |
| 2016/0285260 A1 * | 9/2016 | Kawasoe | H02H 9/046 |
| 2016/0352098 A1 * | 12/2016 | Chaudhry | H02H 9/046 |
| 2019/0081034 A1 * | 3/2019 | Chaudhry | H02H 9/046 |

(Continued)

FOREIGN PATENT DOCUMENTS

| | | | | |
|---|---|---|---|---|
| CN | 1492505 A | * | 4/2004 | |
| CN | 100416822 C | * | 9/2008 | |
| DE | 10341068 A1 | * | 4/2004 | ......... H01L 27/0259 |

(Continued)

OTHER PUBLICATIONS

Zheng, Dao; Electrostatic Discharge protection circuit; 2004-04-528; Entire specification with drawings (Year: 2004).*

*Primary Examiner* — Dharti H Patel

(74) *Attorney, Agent, or Firm* — Yudong Kim; Frank D. Cimino

(57) ABSTRACT

An electrostatic discharge protection system with a node adapted to receive a signal and threshold detecting circuitry coupled to the node. The system includes an IGBT having an IGBT gate coupled to an output of the threshold detecting circuitry, a resistor coupled between an IGBT emitter of the IGBT and a low reference potential node, and a BJT having a BJT base coupled to the IGBT emitter.

27 Claims, 4 Drawing Sheets

(56) References Cited

U.S. PATENT DOCUMENTS

2022/0223581 A1* 7/2022 Mysore Rajagopal ...................... H01L 27/0266

FOREIGN PATENT DOCUMENTS

| FR | 2844929 A1 | * | 3/2004 | ......... H01L 27/0259 |
| GB | 2394846 A | * | 5/2004 | ......... H01L 27/0259 |

* cited by examiner

COMPACT AREA ELECTROSTATIC DISCHARGE PROTECTION CIRCUIT

CROSS-REFERENCE TO RELATED APPLICATION

This application claims the benefit of and priority to U.S. Provisional Application No. 63/136,888, filed Jan. 13, 2021, which is hereby fully incorporated herein by reference.

BACKGROUND

The example embodiments relate to electrostatic discharge (ESD) protection.

ESD protection is sometimes applied to a circuit or circuit node, including an integrated circuit (IC) node, against a potential large discharge that otherwise could damage the circuit. ESD protection can take many forms, and many of those forms consume a large amount of the IC area. Reducing such area consumption, and favorable discharge protection, are often important considerations.

Example embodiments are provided in this document that may improve on certain of the above concepts, as detailed below.

SUMMARY

In one example embodiment, there is an electrostatic discharge protection system. The system comprises a node adapted to receive a signal and threshold detecting circuitry coupled to the node. The system also comprises an IGBT having an IGBT gate coupled to an output of the threshold detecting circuitry, a resistor coupled between an IGBT emitter of the IGBT and a low reference potential node, and a BJT having a BJT base coupled to the IGBT emitter.

Other aspects and embodiments are also disclosed and claimed.

DETAILED DESCRIPTION

Figure 1:
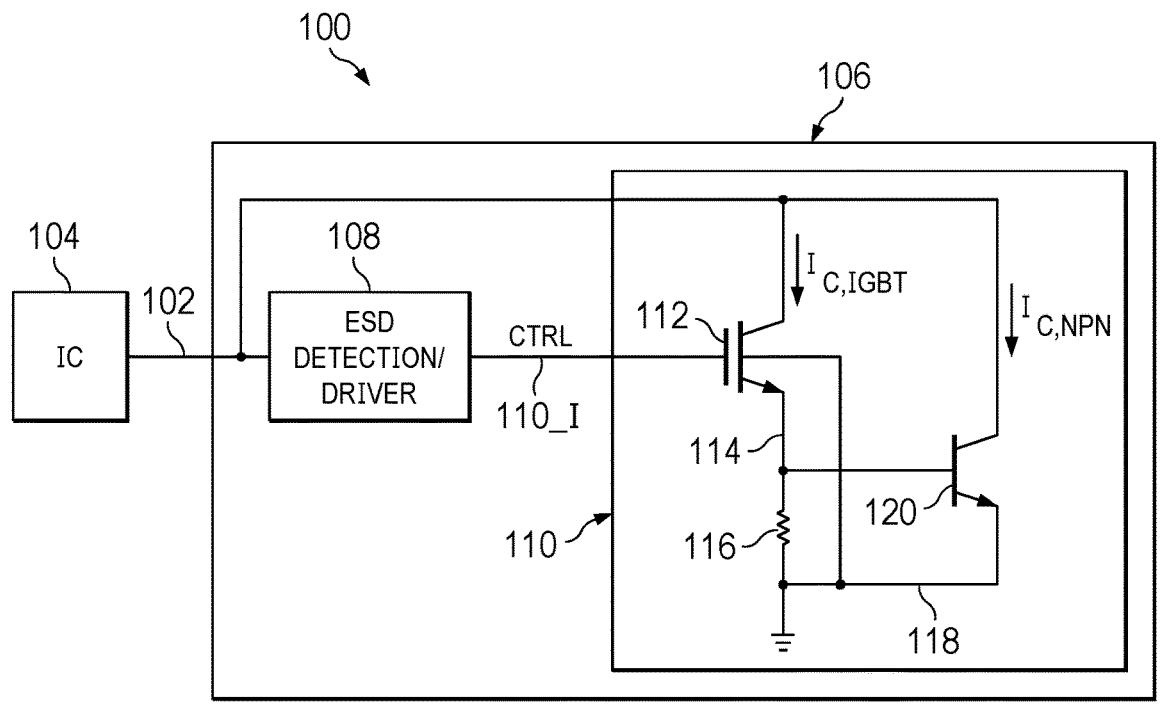
FIG. 1 illustrates an electrical diagram of an ESD protection system.

FIG. 1 illustrates an electrical diagram of an ESD protection system 100. The ESD protection system 100 includes a first node 102 that is ESD protected. As an example, the first node 102 is connected to an IC 104, and more particularly for example to an input or output (or input/output) pad or pin of the IC 104. The IC 104 may be any type of circuit, for example in a relatively high voltage device or environment, where the IC 104 includes circuitry and functionality for a desired application, as is typically described in a specification for the IC.

The first node 102 is also connected to an ESD protection circuit 106. The ESD protection circuit 106 may be an external device or circuit relative to the IC 104, or may be integrated internally within a same boundary (e.g., a same die or package) as the IC 104. The ESD protection circuit 106 include an ESD detection/driver circuit 108 and as ESD current clamp circuit 110. The ESD detection/driver circuit 108 may be constructed by one skilled in the art, and it includes threshold detecting circuitry, coupled to sample signaling at the first node 102 and to output a control signal CTRL in response, where the threshold corresponds to whether ESD protection is required. Specifically, the ESD detection/driver circuit 108 de-asserts CTRL for signaling at the first node 102 that is below its threshold, and it asserts CTRL for signaling at the first node 102 that is above (e.g., or at) the threshold. CTRL is connected to an input 110_I to the ESD current clamp circuit 110, so that when CTRL is asserted, the ESD current clamp circuit 110 shunts (clamps) the current to a low potential node, such as ground. More particularly, the input 110_I is connected to the gate of an insulated-gate bipolar transistor (IGBT) 112. An IGBT is a three terminal (plus body) device with four semiconductor layers, for example in a P-N-P-N configuration for an n-channel IGBT as shown in FIG. 1. The IGBT 112 is controlled by a metal-oxide-semiconductor (MOS) gate, which is connected as the input 110_I. The collector of the IGBT 112 is connected to the first node 102, and the emitter (sometimes referred to as the source) of the IGBT 112 is connected to a second node 114. The second node 114 is connected through a resistor 116 to a third node 118, which is connected to a low reference potential, such as ground. The third node 118 is also connected to the body of the IGBT 112. In an example embodiment, resistance of the resistor 116 is chosen to accomplish aspects described below. Further, the second node 114 is connected to a base of an NPN bipolar transistor (BJT) 120. The collector of the NPN BJT 120 is connected to the first node 102, and the emitter of the NPN BJT 120 is connected to the third node 118.

Figure 2:
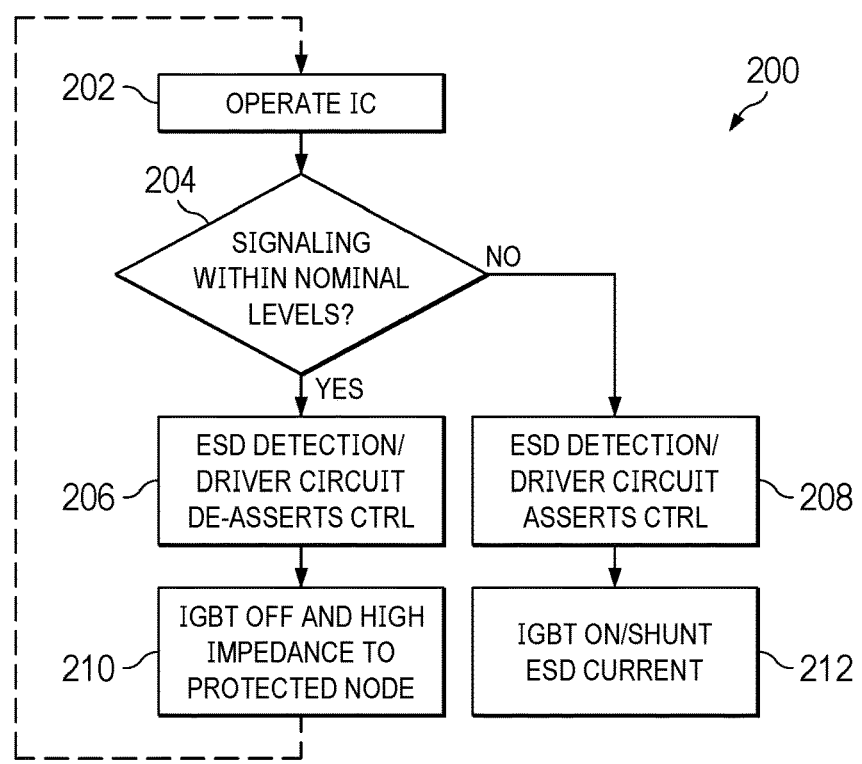
FIG. 2 illustrates a flowchart of an operational method, generally illustrating the operation of the FIG. 1 ESD protection system.

FIG. 2 illustrates a flowchart of an operational method 200, generally illustrating the operation of the FIG. 1 ESD protection system 100. In a step 202, the IC 104 operates according to its functionality and specifications, including receiving signaling at the first node 102. The responsive ESD operation depends, as shown in a conditional step 204, on whether signaling at the first node 102 is within nominal levels that do not require ESD protection, in which case the operational method 200 proceeds to a step 206, or whether signaling at the first node 102 is above nominal levels, in which case the operational method 200 proceeds to a step 208 and ESD protection is enabled. Each scenario is described below.

Step 206 is reached when the first node 102 signaling is within nominal levels, that is, below that requiring ESD protection. In response, in step 206 the ESD detection/driver circuit 108 de-asserts CTRL. The de-asserted CTRL is non-enabling to the IGBT 112, so as shown in a step 210, in response the IGBT 112 is off and its collector current, $I_{C,IGBT}$, is zero or near zero. Further in this regard, the resistance of the resistor 116 is selected, in part, to minimize current leakage through the IGBT 112, when the IGBT 112 is off. Accordingly, when the IGBT 112 is off, the selected resistance of the resistor 116 provides a very low voltage drop across the resistor 116, thereby applying that very low voltage across the base-to-emitter PN junction of the NPN BJT 120, rendering it disabled and conducting little to no current from its collector to emitter. Accordingly, the ESD current clamp circuit 110 provides a high impedance and presents relatively little load to the first node 102 when that node experiences nominal signaling. Still further, while CTRL is de-asserted, the IGBT 112 could be susceptible to undesirable parasitic effects, as further detailed in co-owned U.S. Pat. No. 10,249,610, issued Apr. 2, 2019, which is hereby fully incorporated herein by reference. As detailed therein, such undesirable effects could include the unintended shunting (also called latch-up) of current, during non-ESD events, due to the four layer IGBT structure—including a parasitic PNP transistor in combination with a parasitic NPN transistor—and the structural possibility of the IGBT body voltage exceeding its emitter, creating a low impedance condition. However, in the present example embodiment, the base-to-emitter PN junction of the NPN BJT 120 is connected to the IGBT 112 emitter, while recall the IGBT body is connected to the third node 118 and therefore to a low potential (e.g., ground). Accordingly, when CTRL is de-asserted, any potential across the NPN BJT 120 base-to-emitter PN junction reverse biases the IGBT 112 emitter, relative to the IGBT body, thereby reducing the possibility of the latch-up condition. Lastly, the operational method 200 is an ongoing process when the IC 104 is on, so FIG. 2 illustrates a dashed line returning from step 210 to step 200, as the signaling condition at the first node 102 continues to be sensed for possible ESD protection.

Step 208 is reached when the first node 102 signaling exceeds (e.g., or meets) the ESD threshold and therefore requires ESD protection. In response, in step 208, the ESD detection/driver circuit 108 asserts CTRL. The asserted CTRL applies an enabling gate-to-emitter voltage across the IGBT 112. In response to the asserted CTRL, and as shown in step 212, the IGBT 112 is on and $I_{C,IGBT}$ passes from its collector to emitter, according to the IGBT voltage/current characteristics and therefore further in response to the IGBT gate-to-emitter voltage, $V_{GE\_IGBT}$. Indeed, with a relatively large voltage at the first node 102, then $V_{GE\_IGBT}$ will be correspondingly large, enabling $I_{C,IGBT}$ to shunt a relatively large drive current through the IGBT 112. $I_{C,IGBT}$ also causes a voltage drop across the resistor 116, which has a resistance that also is selected to ensure that the anticipated magnitude of $I_{C,IGBT}$, times the selected resistance, will be sufficient to forward bias the base-to-emitter PN junction of the NPN BJT 120. Accordingly, at the same time that $I_{C,IGBT}$ is shunted to the third node 118, the NPN BJT 120 conducts collector current, $I_{C,NPN}$, also to the third node 118. Collectively, therefore, the total current shunted by the ESD current clamp circuit 110 during an ESD event, from the first node 102 to the third node 118, is $I_{C,IGBT}+I_{C,NPN}$. Note also that the presence of the NPN BJT 120 base-to-emitter junction that generates a reverse bias on the IGBT 112 body-emitter junction also can be important, even when CTRL is asserted. Specifically, CTRL may experience a spurious triggering event during a power supply ramp or if there is noise on the power supply protected by the IGBT 112; the body-to-emitter reverse bias inhibits triggering of the parasitic latch-up (IGBT SCR) during this condition.

Given the preceding, the ESD protection circuit 106 provides numerous benefits. For example, in a typical high-voltage system that implements ESD protection, the ESD protective circuitry can consume a considerable amount of the die area. Some prior art ESD circuitry implements drain extended MOS transistors (DEMOS) or laterally-diffused MOS transistors (LDMOS), while example embodiments implement an IGBT, which may have up to three times drive current during an ESD event while maintaining a robust safe operating area and a 20% to 50% reduction in clamp area.

Further, the inclusion of the NPN BJT 120 connected to the IGBT 112 provides benefits during operation, either during periods when ESD events are not occurring, or when ESD signaling occurs. When ESD events are not occurring, which is the majority of the time, the ESD protection circuit 106 has relatively high impedance, low leakage, and suppressed IGBT parasitic effects. When an ESD event occurs, the cumulative ESD drive current capacity is increased (e.g., by the NPN BJT 120 gain, times its base current, which is the emitter current of the IGBT 112).

Figure 3:
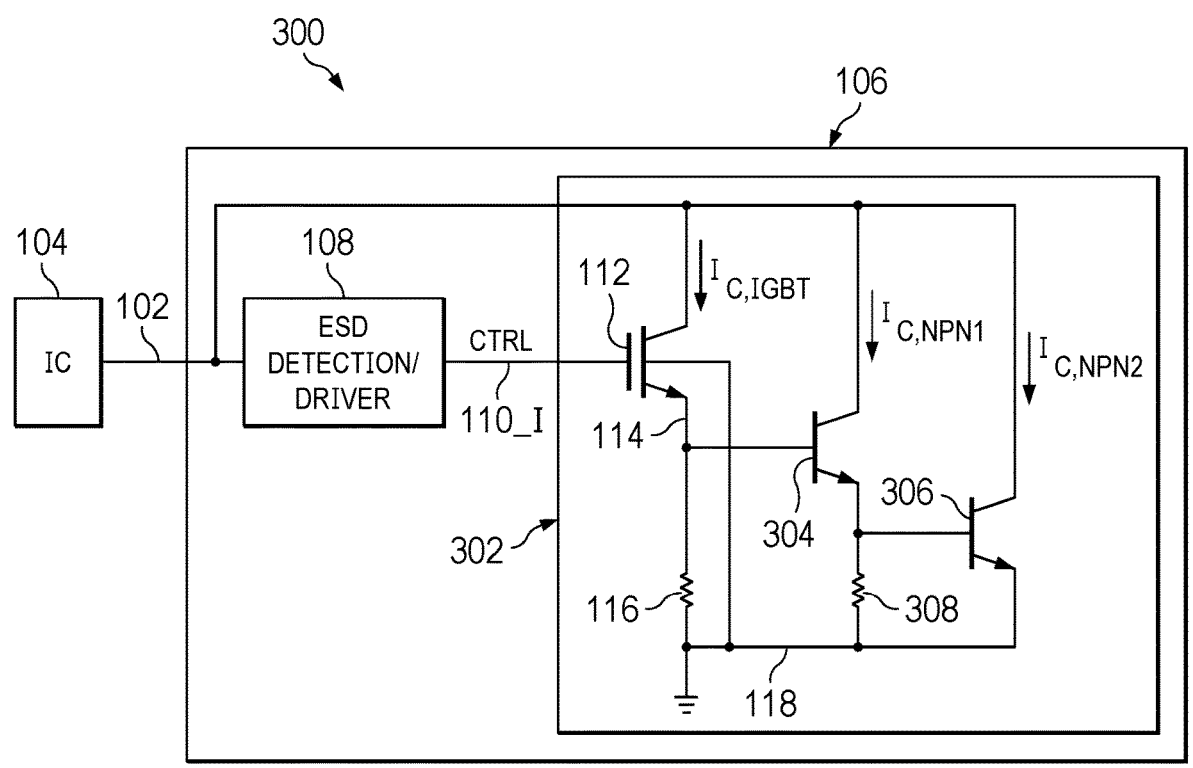
FIG. 3 illustrates an electrical diagram of an alternative embodiment ESD protection system.

FIG. 3 illustrates an electrical diagram of an alternative embodiment ESD protection system 300. The ESD protection system 300 includes various of the same components as the FIG. 1 ESD protection system 100, so for those same components like reference numbers are used in both FIGS. 1 and 3. With respect to differences in those system, the ESD protection system 300 includes an ESD current clamp circuit 302, which again includes the IGBT 112 having its gate connected to the input 110_I, its collector connected the first node 102, and its body, and its emitter through a resistor 116, connected to the third node 118. Additionally, the ESD protection system 300 includes plural NPN BJTs, which in the example shown that plurality includes a first NPN BJT 304 and a second NPN BJT 306. The second node 114 is connected to the base of the first NPN BJT 304. The collector of the first NPN BJT 304 is connected to the first node 102, and the emitter of the first NPN BJT 304 is connected through an additional resistor 308 to the third node 118. The emitter of the first NPN BJT 304 is also connected to the base of the second NPN BJT 306. The collector of the second NPN BJT 306 is connected to the first node 102, and the emitter of the second NPN BJT 306 is connected to the third node 118.

The operation of the ESD protection system 300 is now described. In general, the FIG. 3 ESD detection driver 108 and the IGBT 112 operate as earlier described with respect to the FIG. 2 method 200 (and relative to the FIG. 1 ESD protection system 100). Accordingly, the following supplements the earlier descriptions of those devices.

When the FIG. 3 first node 102 signaling is within nominal levels, thereby not requiring ESD protection, again the ESD detection/driver circuit 108 de-asserts CTRL. Responsively, the IGBT 112 is off and its collector current, $I_{C,IGBT}$, is zero or near zero. Accordingly, there is at most negligible voltage across the resistor 116. This negligible voltage is coupled to the base of the first NPN BJT 304, and is insufficient to enable that first NPN BJT 304, so the first NPN BJT 304 is also off and its collector current, $I_{C,NPN1}$, is zero or near zero. With the first NPN BJT 304 off, its emitter voltage, coupled to the base of the second NPN BJT 306, is insufficient to enable that second NPN BJT 306, so the second NPN BJT 306 is also off and its collector current, $I_{C,NPN2}$, is zero or near zero. Accordingly, the ESD current clamp circuit 302 provides a high impedance and presents relatively little load to the first node 102, when that node experiences nominal signaling. Further, when CTRL is de-asserted, any potential across the first NPN BJT 304 base-to-emitter PN junction reverse biases the IGBT 112 emitter, relative to the IGBT body, thereby reducing the possibility of a latch-up condition.

When the FIG. 3 first node 102 signaling exceeds the ESD threshold and therefore requires ESD protection, again the ESD detection/driver circuit 108 asserts CTRL, turning on the IGBT 112 and shunting a considerable amount of collector current $I_{C,IGBT}$ through the resistor 116. The responsive voltage drop across the resistor 116 forward biases the base-to-emitter junction of the first NPN BJT 304, enabling that BJT so that it shunts a collector current, $I_{C,NPN1}$, through the additional resistor 308, to the third node 118. The responsive voltage drop across the additional resistor 308 forward biases the base-to-emitter junction of the second NPN BJT 306, enabling that BJT so that it shunts a collector current, $I_{C,NPN2}$, to the third node 118. Collectively, therefore, the total current shunted by the ESD current clamp circuit 302 during an ESD event, from the first node 102 to the third node 118, is $I_{C,IGBT}+I_{C,NPN1}+I_{C,NPN2}$.

The combination of FIGS. 1 and 3 demonstrates that differing embodiments are contemplated, each with a differing number of NPN stages after the IGBT 112. FIG. 1 includes one such stage, while FIG. 3 includes two. Also where two or more stages are so included, each stage other than the final stage includes a resistor between its emitter and a low potential (e.g., ground) node, in part to turn on the next stage when a discharge is desired. Moreover, each BJT stage contributes to the total current that may be shunted (discharged) by the embodiment in response to an ESD event. More particularly, each stage provides the shunt current as its respective collector current, which is the product of its gain (β) times its base current. In FIG. 3, the base current in the configuration of ESD current clamp circuit 302 cascades, that is, the base current to the first NPN BJT 304 relates to the emitter (or source) current of the IGBT 112, and the base current to the second NPN BJT 306 relates to the emitter current of the first NPN BJT 304. Accordingly, assuming β for each of the first NPN BJT 304 and the second NPN BJT 306 is considerably greater than one, then each additional of those BJTs, and if one or more additional like stages were added, adds approximately β times the emitter current of the IGBT 112, thereby collectively increasing the total current that can be shunted by the ESD current clamp circuit 302. Additionally in FIG. 3, each additional NPN stage increases the IGBT 112 body-to-emitter bias by one PN (diode) drop, that is, the base-to-emitter drop of each NPN stage. These additive diode drops may be beneficial to counteract that some IGBTs have a strong parasitic SCR, so the additional diode drops of applied reverse bias will increase the chance of inhibiting the latch-up triggering of such IGBTs. For these cases, the ESD current benefit of the NPNs is most significant. In all events, one skilled in the art, however, may find competing reasons to limit a total number of stages to that shown in FIG. 3, for example.

Figure 4:
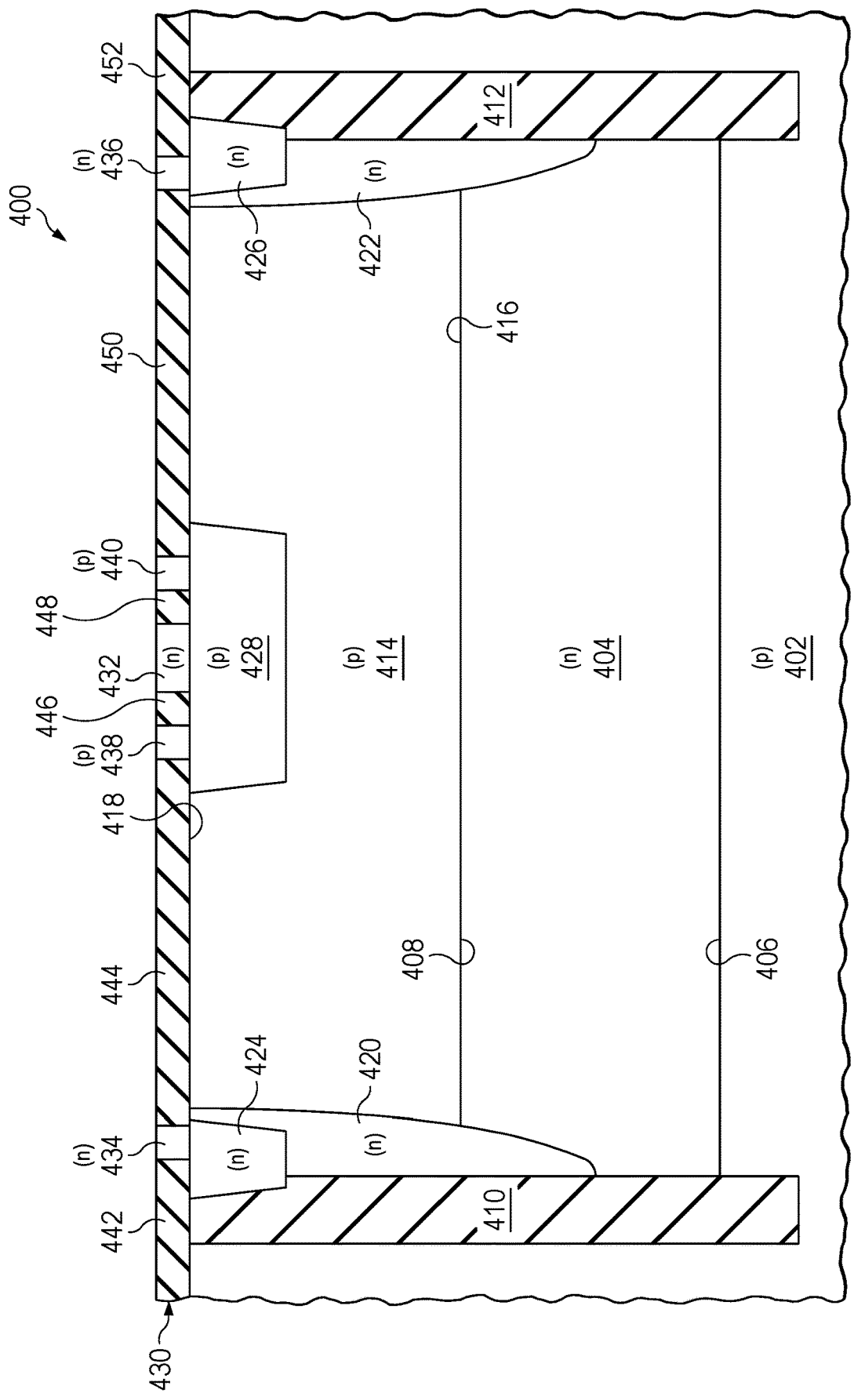
FIG. 4 illustrates a cross-sectional side view of a vertical NPN transistor as may be used for the NPN transistors in either of the FIG. 1 and FIG. 3 ESD protection systems.

FIG. 4 illustrates a cross-sectional side view of a vertical NPN transistor 400, as may be used for the NPN transistors in either of the ESD protection systems 100 or 300, described above. The vertical NPN transistor 400 includes a substrate 402 that may be formed of silicon, for example doped with p-type implants, or alternatively the substrate 402 may be a portion of a deep p-type well. A buried n-type layer 404 is formed in the substrate 402, with a lower surface 406 and an upper surface 408. A portion of the buried n-type layer 404 is also isolated by a first and second deep trench region 410 and 412, formed for example by insulating materials in those regions and shown only for illustrative purposes, as other processes may omit them. A buried p-type layer 414 is formed (e.g., epitaxially) above the upper surface 408 of the buried n-type layer 404, having a lower surface 416 and an upper surface 418. Deep n-type implanted regions 420 and 422 are formed adjacent the first and second deep trench region 410 and 412, respectively. Shallow n-wells 424 and 426 are formed downward from the upper surface 418 of the buried p-type layer 414, into the deep n-type implanted regions 420 and 422, respectively. A shallow p-well 428 is also formed downward from the upper surface 418 of the buried p-type layer 414. A layer 430 is formed above the upper surface 418 of the buried p-type layer 414, and it is partitioned (e.g., etched and doped) to form various regions, including: (i) a central n-type (e.g., heavy n+ doping) region 432 physically abutting a portion of the shallow p-well 428; (ii) a first and second n-type contact region 434 and 436, each abutting a respective one of the shallow n-wells 424 and 426; and (iii) a first and second p-type contact region 438 and 440, also both physically abutting a portion of the shallow p-well 428 and symmetrically maintaining a uniform base resistance. Lastly, trench isolation regions 442, 444, 446, 448, 450, and 452 may be formed between the various regions above the upper surface 418 of the buried p-type layer 414. Given the preceding, the vertical nature of the vertical NPN transistor 400 may be appreciated. Particularly, the transistor n-type emitter is provided by the central n-type (e.g., heavy n+ doping) region 432. The transistor p-type base is provided by the shallow p-well 428, and the buried p-type layer 414, with contact to that base by the first and second p-type contact regions 438 and 440. And, the transistor n-type collector is provided by the buried n-type layer 404, the deep n-type implanted regions 420 and 422, the shallow n-wells 424 and 426, and the first and second n-type contact regions 434 and 436.

Figure 5:
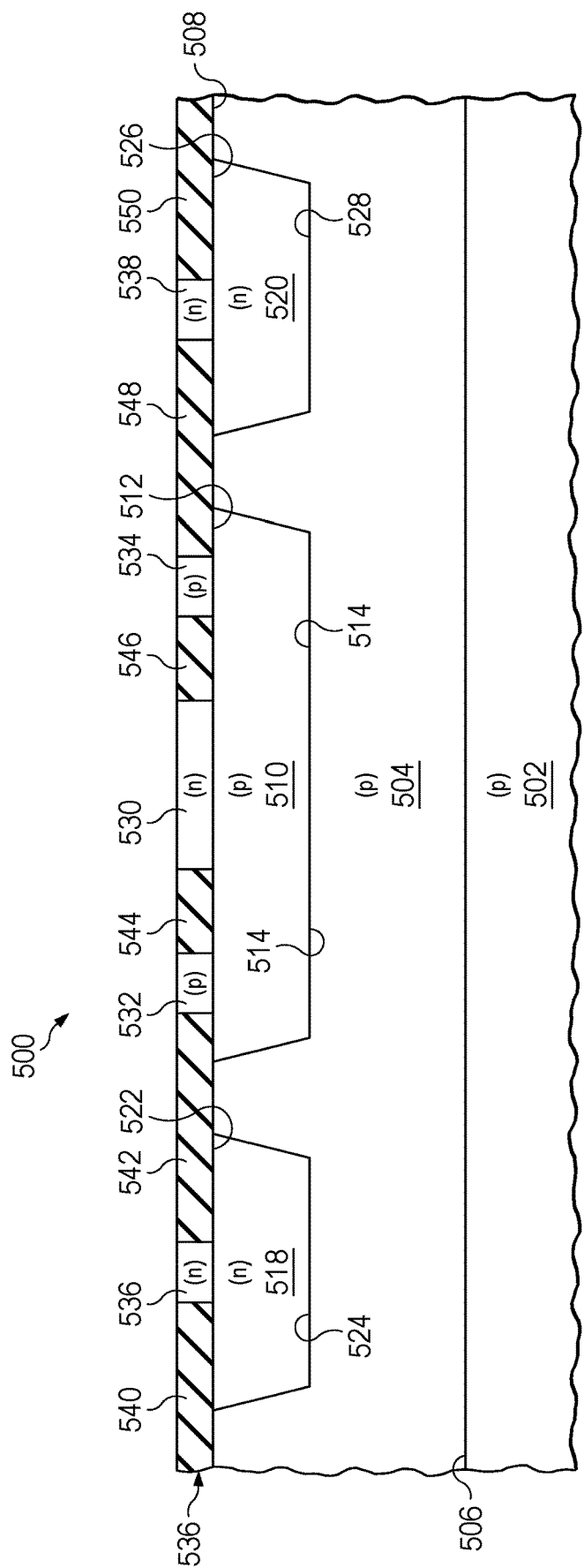
FIG. 5 illustrates a cross-sectional side view of a lateral NPN transistor as may be used for the NPN transistors in either of the FIG. 1 and FIG. 3 ESD protection systems.

FIG. 5 illustrates a cross-sectional side view of a lateral NPN transistor 500, as may be used for the NPN transistors in either of the ESD protection systems 100 or 300, described above. The lateral NPN transistor 500 includes a substrate 502 that may be formed of silicon, for example doped with p-type implants, or alternatively the substrate 502 may be formed as a deep p-type well. A buried p-type layer 504 is formed in the substrate 502, with a lower surface 506 and an upper surface 508. A centrally-located shallow p-well 510, with an upper surface 512 and a lower surface 514, is formed above the buried p-type layer 504 and downward from the upper surface 508 of the buried p-type layer 504. A first and second laterally-located shallow n-well 518 and 520 are also formed above the buried p-type layer 504. The first laterally-located shallow n-well 518 has an upper surface 522 and a lower surface 524, and the second laterally-located shallow n-well 520 has an upper surface 526 and a lower surface 528. Various regions are formed above the plane of the upper surfaces 512, 522, and 526, including: (i) an n-type region 530 above and in contact with the centrally-located shallow p-well 510; (ii) two p-type regions 532 and 534 above and in contact with the centrally-located shallow p-well 510; (iii) respective n-type 536 regions and 538 above and in contact with the first and second laterally-located shallow n-well 518 and 520. Lastly, trench isolation regions 540, 542, 544, 546, 548, and 550 may be formed between the various regions above the upper surface 522 of the substrate 502. Given the preceding, the lateral (or partially lateral) nature of the lateral NPN transistor 500 may be appreciated. Particularly, the transistor n-type emitter is provided by the central n-type (e.g., heavy n+ doping) region 530. The p-type base is provided by the p-well 510 and in part the buried p-type layer 504. And, the transistor n-type collector is provided by the shallow n-well 518 and the n-type region 536, and similarly by the shallow n-well 520 and the n-type region 538.

The illustrated example embodiments provide increased shunted current for improved electrostatic discharge protection and favorable control of IGBT parasitics. The additional BJT structure may contribute to area used, but may still be favorable to provide protection and also without other more area-consuming ESD technologies. Further, the use of BJT structure may be included in some existing processes that already include steps for other devices, where such steps can include the structure needed to implement the BJT and, therefore, without adding to the process. Further, while the above-described attributes are shown in combination, the inventive scope includes subsets of one or more features in other embodiments. Still further, also contemplated are changes in various parameters, including implementation in silicon, with the preceding providing only some examples, with others ascertainable, from the teachings herein, by one skilled in the art. Accordingly, additional modifications are possible in the described embodiments, and other embodiments are possible, within the scope of the following claims.

What is claimed is:

1. An electrostatic discharge protection system, comprising:
    a first signal node adapted to receive a signal;
    threshold detecting circuitry coupled to the first signal node;
    an IGBT having an IGBT gate coupled to an output of the threshold detecting circuitry;
    a resistor coupled between an IGBT emitter of the IGBT and a low reference potential node, wherein the IGBT has a body coupled to the low reference potential node; and
    a BJT having a BJT base coupled to the IGBT emitter.

2. The electrostatic discharge protection system of claim 1 wherein the BJT has a BJT emitter coupled to the low reference potential node.

3. The electrostatic discharge protection system of claim 1:
    wherein the IGBT has an IGBT collector coupled to a second signal node; and
    wherein the BJT has a BJT collector coupled to the second signal node.

4. The electrostatic discharge protection system of claim 3 wherein the second signal node is the first signal node adapted to receive the signal.

5. The electrostatic discharge protection system of claim 1 and further comprising an integrated circuit comprising the IGBT, the resistor, and the BJT.

6. The electrostatic discharge protection system of claim 1 and further comprising an integrated circuit external from the IGBT, the resistor, and the BJT.

7. The electrostatic discharge protection system of claim 1 wherein the BJT comprises a lateral BJT.

8. The electrostatic discharge protection system of claim 1 wherein the BJT comprises a vertical BJT.

9. The electrostatic discharge protection system of claim 1 wherein the BJT comprises an NPN BJT.

10. The electrostatic discharge protection system of claim 9 wherein the IGBT comprises a P-N base-to-emitter junction.

11. The electrostatic discharge protection system of claim 1, wherein the BJT comprises a first BJT, and further including a plurality of BJTs, the plurality of BJTs including the first BJT, wherein each BJT in the plurality of BJTs, other than the first BJT, has a base coupled to an emitter of another BJT in the plurality of BJTs.

12. The electrostatic discharge protection system of claim 11 wherein each respective BJT in the plurality of BJTs, other than a BJT in a last stage of the plurality of BJTs, has a resistor coupled between an emitter of the respective BJT and the low reference potential node.

13. The electrostatic discharge protection system of claim 11 wherein an emitter of the BJT in a last stage of the plurality of BJTs has an emitter coupled to the low reference potential node.

14. The electrostatic discharge protection system of claim 1, wherein the threshold detecting circuitry is configured to enable the IGBT based on determining that the signal exceeds a threshold.

15. An electrostatic discharge protection system, comprising:
    a signal node adapted to receive a signal;
    threshold detecting circuitry coupled to the signal node;
    an IGBT including a body coupled to a low reference potential node, the IGBT having:
        an IGBT gate coupled to an output of the threshold detecting circuitry; and
        an IGBT collector coupled to the signal node;
    a resistor coupled between an IGBT emitter and the low reference potential node; and
    a BJT having a BJT base coupled to the IGBT emitter.

16. The electrostatic discharge protection system of claim 15:
    wherein the BJT has an emitter coupled to the low reference potential node and a collector coupled to the signal node.

17. The electrostatic discharge protection system of claim 15, wherein the threshold detecting circuitry is configured to enable the IGBT based on determining that the signal exceeds a threshold.

18. The electrostatic discharge protection system of claim 15, wherein the BJT has a BJT emitter coupled to the low reference potential node.

19. The electrostatic discharge protection system of claim 15, wherein the BJT has a BJT collector coupled to the signal node.

20. The electrostatic discharge protection system of claim 15, wherein the BJT is a first BJT, and further comprising a second BJT with a base coupled to an emitter of the first BJT.

21. The electrostatic discharge protection system of claim 20, wherein the resistor is a first resistor, and further comprising a second resistor coupled between the emitter of the first BJT and the low reference potential node.

22. The electrostatic discharge protection system of claim 20, wherein the second BJT has an emitter coupled to the low reference potential node.

23. The electrostatic discharge protection system of claim 20, wherein the second BJT has a collector coupled to the signal node.

24. A method of operating an electrostatic discharge protection system, comprising:
    receiving a signal at a node;
    determining whether the signal exceeds a threshold;
    responsive to determining that the signal exceeds the threshold, performing the steps of:
        enabling an IGBT so that a first portion of the signal is discharged by the IGBT, wherein the IGBT includes a body coupled to a low reference potential node; and
        enabling a BJT coupled to the IGBT so that a second portion of the signal is discharged by the BJT.

25. The method of claim 24 wherein the first portion and the second portion are coupled to the node.

26. The method of claim 24 wherein the BJT is a first BJT, and further comprising, responsive to determining that the signal exceeds the threshold, enabling a second BJT coupled to the first BJT so that a third portion of the signal is discharged by the second BJT.

27. The method of claim 24 and further comprising coupling a reverse biased PN junction to an emitter of the IGBT when the signal exceeds the threshold.

* * * * *